United States Patent

Menkhoff

[11] Patent Number: 6,163,787
[45] Date of Patent: Dec. 19, 2000

[54] FACILITY FOR REDUCING A DATA RATE

[76] Inventor: Andreas Menkhoff, Hoeslstrasse, Munich, Germany, D-81297

[21] Appl. No.: 09/110,004

[22] Filed: Jul. 2, 1998

[30] Foreign Application Priority Data

Jul. 2, 1997 [EP] European Pat. Off. .............. 97110913

[51] Int. Cl.[7] .............................. G06F 17/17; G06F 17/10
[52] U.S. Cl. ............................................ 708/313; 708/316
[58] Field of Search ..................................... 708/300, 313, 708/316

[56] References Cited

U.S. PATENT DOCUMENTS

| | | | |
|---|---|---|---|
| 4,999,798 | 3/1991 | McCaslin et al. | 708/313 |
| 5,528,527 | 6/1996 | Iwata et al. | 708/313 |
| 5,619,438 | 4/1997 | Farley et al. | 708/313 |
| 5,694,345 | 12/1997 | Peterson | 708/313 |
| 5,777,908 | 7/1998 | Inogai | 708/313 |
| 5,777,911 | 7/1998 | Sherry et al. | 708/316 |
| 5,831,879 | 11/1998 | Yom et al. | 708/316 |

*Primary Examiner*—Tan V. Mai

[57] ABSTRACT

A facility for reducing the data rate of a data sequence (d1) is provided, including a switchable filter device (1) which delivers first output values (dn) after a sampling intervals in a first state and second output values (dm) after a +1 sampling intervals in a second state, and which has at least one tracking data window (dw) of different sizes (dwf1, dwf2) for forming filtered data values (df). A control device (10) causes n first output values (dn) and m second output values (dm) to be formed within equally long time periods (l2) of the data sequence (d1), with the number of n first and m second output values being determined by a rule r=a+m/(n+m), where r is a desired data rate reduction factor.

20 Claims, 3 Drawing Sheets

FACILITY FOR REDUCING A DATA RATE

FIELD OF INVENTION

This invention relates to a facility for reducing the data rate of a data sequence which serves particularly to reduce the sampling rate of digitized signals by a noninteger factor.

BACKGROUND OF THE INVENTION

Such facilities are necessary, for example, where predetermined data sequences are to be adapted to different processing clocks while the signal contents proper are to remain unchanged. Such applications relate particularly to oversampled audio signals, but also to video and other signals whose sampling rate has to be reduced by a noninteger factor for further processing or storage. The invention can also be used where the signal content is to be changed. In the case of video signals, for example, the invention permits the reproduction of an image of reduced size. By reducing of the number of data while maintaining the data rate, an image of reduced size can be displayed in a window of a television or computer screen. The resulting image may be, for example, a still image, a moving television image, or a computer-controlled animation.

In general, relatively complex interpolation filters with transversal and/or recursive filter stages are used for such applications to permit a reduction of the data rate by a noninteger factor. Such sampling-rate converters are described, for example, by Tor A. Ramstad, "Digital Methods for Conversion Between Arbitrary Sampling Frequencies", Transactions on Acoustics, Speech, and Signal Processing, Vol. ASSP-32, No. 3, June 1984, pages 577 to 591.

The facilities for reducing the data rate are relatively easy to implement if the old and new data rates differ by only one sample value in successive equal sampling intervals, for example if two new samples are to be formed from three successive samples—this corresponds to a data rate reduction factor of r=1.5—or if nine new samples are to be interpolated from ten old samples—this corresponds to a data rate reduction factor of r=10/9. For these specific data rate reduction factors, very simple filter devices are known in which one sample is omitted at regular intervals and the remaining data sequence is smoothed with a digital low-pass filter.

Particularly simple circuits and methods are known if the data rate is reduced by an integer factor r. In that case, groups of data values which form a data window are added together to form a new data value, and the sequence of new data values then forms the desired new data sequence. In digital signal processing, this type of sampling rate reduction is also referred to as decimation. The data values in the data window may be modified according to the selected interpolation method by an associated weighing function. In view of the simplest weighing case, in which the data within the data window are not weighted, these circuits are also referred to as "comb filters". They are described in an article by Shuni Chu and C. Sidney Burrus, "Multirate Filter Designs Using Comb Filters", IEEE Transactions on Circuits and Systems, Vol. CAS-31, No. 11, November 1984, pages 913 to 924.

Such comb filters generally comprise at least one accumulator, one decimation switch which is closed after the predetermined number of samples, and one differentiator. Each accumulator contains a delay stage and an adder, and each differentiator contains a delay stage and a subtracter. The adders and differentiators together form a tracking data window for forming the interpolated sample value. A single accumulator does not perform a weighing function. With two or more series-connected accumulators and an equal number of series-connected differentiators, however, even higher-order weighing functions can be implemented. If the last accumulator is designed as a resettable accumulator which is reset together with the decimation switch, the number of differentiators required will be reduced by one. The comb filter structure also has the advantage that a high processing clock frequency is only necessary for the accumulators, while the differentiators operate at the lower clock frequency of the decimation switch.

It is an object of the invention to provide a simple circuit for reducing the data rate by a noninteger factor which can be represented as a rational number.

SUMMARY OF INVENTION

A facility for reducing the data rate of a data sequence (d1), including: a switchable filter device (1) which delivers first output values (dn) after a sampling intervals in a first state and second output values (dm) after a+1 sampling intervals in a second state, and has at least one tracking data window (dw; dw1, dw2) for forming filtered data values (df; df', df''), wherein if only one tracking data window (dw) is present, this data window (dw) is assigned at least two different window sizes (dwf1, dwf2) whose selection is dependent on the sequence of the first(dn) and second output values (dm), and, if more than one tracking data window (dw1, dw2) are present, these are assigned at least two different window sizes (dwf1, dwf2), and the selection of the respective data window (dw1, dw2) with the associated window size is dependent on the sequence of the first (dn) and second output values (dm), and one (dwf1) of the window sizes (dwf1, dwf2) comprises b samples, and the other (dwf2) c samples, with $b \geq a$ and $c \geq a+1$; and a control device (10) which is coupled to the switchable filter device (1) and, by means of the first and second states, causes the formation of n first output values (dn) and m second output values (dm) as well as the selection of the associated window sizes (dwf1, dwf2) or data windows (dw1, dw2) within equally long time periods (I2) of the data sequence d1, the number of n first (dn) and m second output values (dm) being determined by a rule $r=a+m/(n+m)$, where r is a data rate reduction factor.

DETAILED DESCRIPTION OF THE INVENTION

Figure 1:
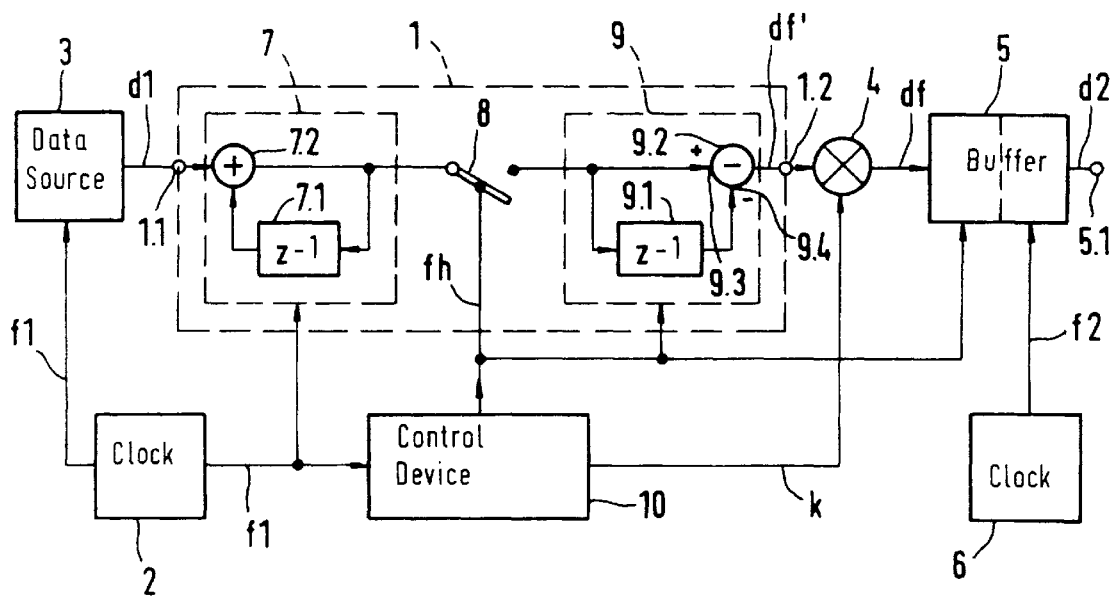
FIG. 1 is a block diagram of an embodiment with a series structure.

The object is attained by:

a switchable filter device which delivers first output values after a sampling intervals in a first state and second output values after a+1 sampling intervals in a second state, and has at least one tracking data window for forming filtered data values, wherein if only one tracking data window is present, this data window is assigned at least two different window sizes whose selection is dependent on the sequence of the first and second output values, or if more than one tracking data window are present, these are assigned at least two different window sizes, and the selection of the respective data window and the associated window size is dependent on the sequence of the first and second output values, and one of the window sizes comprises b samples, and the other c samples, with $b \geq a$ and $c \geq a+1$; and a control device which is coupled to the switchable filter device and, by means of the first and second states, causes the formation of n first output values and m second output values as well as the selection of the associated window sizes or data windows within equally long time periods of the data sequence d1, the number of n first and m second output values being determined by a rule $r=a+m/(n+m)$, where r is a data rate reduction factor.

An advantageous embodiment of the invention results for the first case if the above comb filter, which may be a first- or higher-order filter, is used in a series configuration as the basic structure for the switchable filter device (cf. EP Patent Application No. 97 110 913.7, filed Jul. 2, 1997, internally: C-DIT-1734). The order of the filter determines the number of accumulators and differentiators. The number of differentiators can be reduced by one if the last accumulator is resettable. The switchable filter device may also be implemented with other filter structures or by program control, namely by realizing the intended digital transfer functions using suitable programs. Since, as a rule, normalized signal ranges are used in digital signal processing, the switchable filter device must be supplemented with an amplitude-normalizing device, particularly if the gains in the first and second states are relatively different. In the new data sequence, the first and second output values are distributed in alternating succession as uniformly as possible, so that the interpolated samples are temporally as close to the theoretical samples as possible.

If more stringent requirements are placed on the smoothing behavior of the switchable filter device, higher-order filter structures, such as Lagrange filters or the above-mentioned multiple arrangements of comb filters, will be used for the individual filters. These filter structures must then have different window sizes. A disadvantage with such filter structures may be the different groups delays, which result in signal distortions. Compensation for these group delays is possible if separate signal paths are used for the switchable filter device which contain one higher-order filter each. According to the second case of the above solution, this results in a parallel structure of the switchable filter device which allows the use of suitable equalizing devices for the group delay in a simple manner. Compensation for the individual group delays is possible, for example, by means of different delay elements in the parallel-connected signal paths. The faster filter structure is thus delayed with respect to the slower filter structures by a given number of clock periods. If parallel comb filters are used, the tracking data window is started independently of the other comb filter by the fixing of the closing time of the decimation switch and/or the time of activation of the resetting facility. A combining device receives the output value from one of the parallel-connected filters and forms the desired output data sequence via a buffer.

Through the delay of the data output in one of the filter branches and through the selection of the starting time of the data window in the other filter branch it is possible independently of the respective type of filter used that the filtered data values are always available to the combining device in time, so that the switching at the output end will not result in any signal discontinuity.

The invention and further advantages will now be explained in more detail with reference to the accompanying drawings.

The block diagram of FIG. 1 shows, as a first embodiment of the invention, a facility with a simple series filter structure for reducing the data rate of a data sequence d1 which is converted into an output data sequence d2 by means of a switchable filter device 1. The data rate of the input data sequence d1 corresponds to the pulse repetition rate of a first clock signal f1 which is provided by a first clock source 2 and controls a data source 3. The first clock signal f1 may also correspond to a system clock or be predetermined by the data rate of the data sequence d1, from which it can be recovered by means of a phase-locked loop (PLL).

The switchable filter device 1 is connected to the data source 3 via the filter input 1.1 and provides at its output 1.2 first filtered data values df', which are adapted with an amplitude-normalizing device 4 if necessary, and then form the filtered data values proper, df. The amplitude adaptation is accomplished by applying an attenuation factor k to a multiplier, the attenuation factor having the values $k=1/b$ and $k=1/c$, for example. The filtered data values df are fed to a buffer whose output stage is controlled by a second clock signal f2 from a second clock source 6. The pulse repetition rate of the second clock signal f2 corresponds to the desired data rate of the output data sequence d2 provided at a buffer output 5.1, which thus is the output of the overall data-rate-reducing facility.

The switchable filter device 1 contains, in the direction of signal flow, an accumulator 7, a decimation switch 8, and a differentiator 9. The accumulator 7 forms a ring circuit consisting of an adder 7.2 and a delay element 7.1, with the output of the adder 7.2 connected to the input of the decimation switch 8, whose control input is controlled by an auxiliary clock fh which is locked to the first clock source or the first clock signal f1 via a control device 10. The auxiliary clock fh is a non-equidistant clock sequence, cf. in FIG. 5 the pulse train fh, in which a pulse is triggered after every a or a+1 clock periods T1 of the first clock signal f1. With each pulse of the auxiliary clock fh, the decimation switch 8 is closed, so that the contents of the accumulator 7 are transferred via the signal output of the decimation switch 8 into the differentiator 9. The differentiator consists of a delay element 9.1 and a subtracter 9.2 whose minuend input 9.3 is connected to the input of the delay element 9.1 and to the signal output of the decimation switch 8. The output of the delay element 9.1 is applied to the subtrahend input 9.4, so that the respective contents of the delay element 9.1 are subtracted from the current accumulator contents. This subtraction occurs each time the auxiliary clock fh closes the decimation switch 8.

Thus, the filtered data value df' at the output 1.2 of the filter device 1 is the sum value of the input data sequence d1 in a tracking data window dw (see FIG. 5) whose length is determined by the associated interval of the auxiliary clock fh. If, for example, the auxiliary clock fh alternates between two and three sample values of the first clock f1, a data rate reduction by a factor of $r=2.5$ is obtained. If the auxiliary clock fh is, on a time average, formed from three data windows with $b=2$ samples each and two data windows with $c=3$ samples each, this corresponds to a data rate reduction by a factor of $r=2.4$. In this manner, not only simple sampling rate ratios, but, through intermediate conversions by integer factors, much more complicated ones can be realized, such as the adaptation of an audio signal being received at a data rate of 18.43 MHz to a 20.25-MHz system clock, with the resulting, relatively low data rate lying in the range of 32 kHz.

Figure 5:
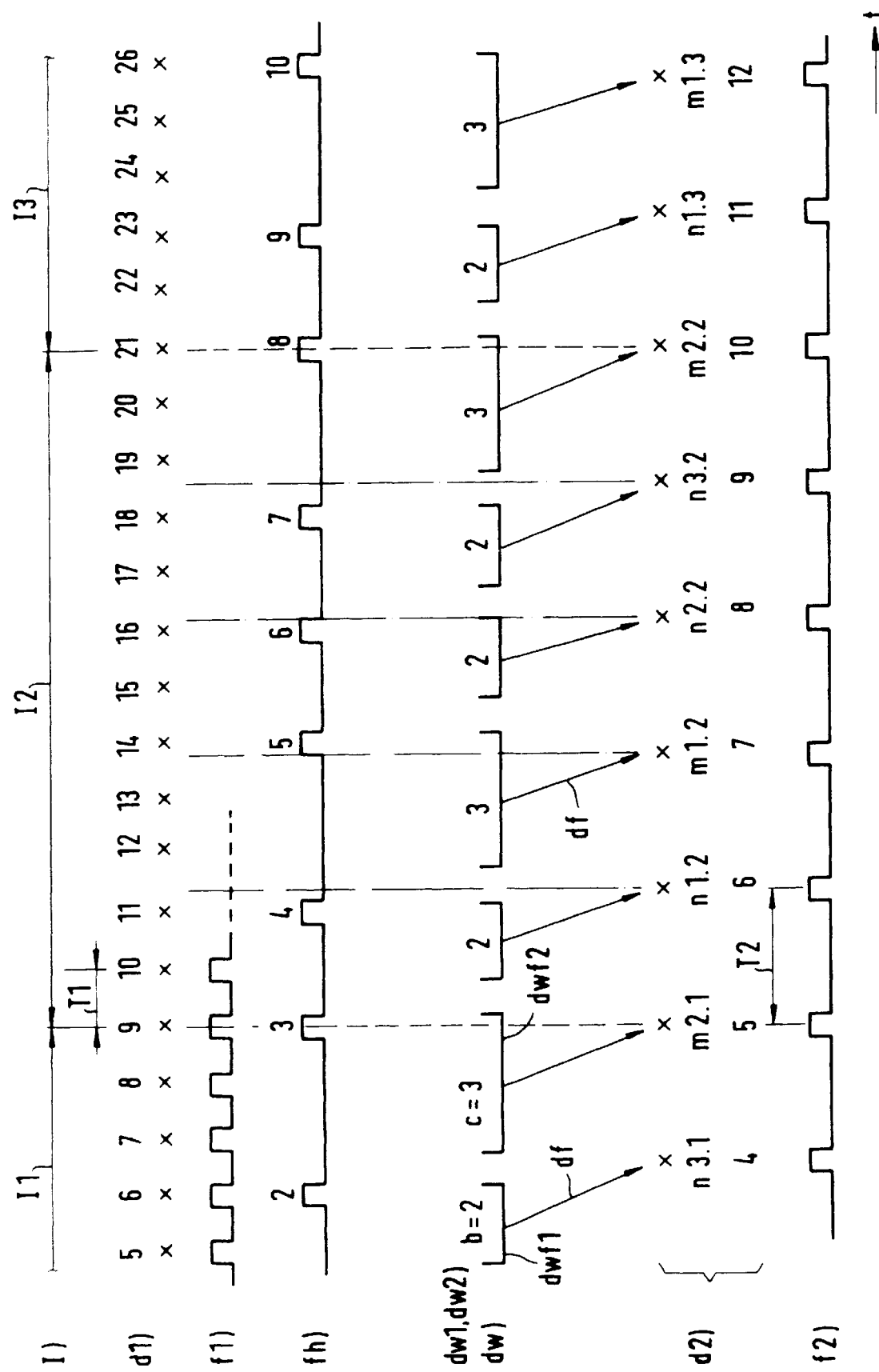
FIG. 5 is a timing diagram illustrating a simple example for reducing the data rate.

The control device 10 can be implemented, for example, with a resettable counter which is clocked by the first clock signal f1 and which, according to the numerical example of FIG. 5 with a reduction factor of r=2.4, is always reset at the number 12. The counts 0.5 and 7, which are dependent on the input clock signal f1, trigger the first state, and the counts; 2 and 9 trigger the second state. The triggering counts, including the reset value, may be stored in a table from which they are retrievable using the reduction factor r as an address. Via a bus, the contents of a corresponding read/write memory can be changed by the user or by an external or internal computing circuit, so that an arbitrary number of reduction factors r can be implemented.

Figure 2:
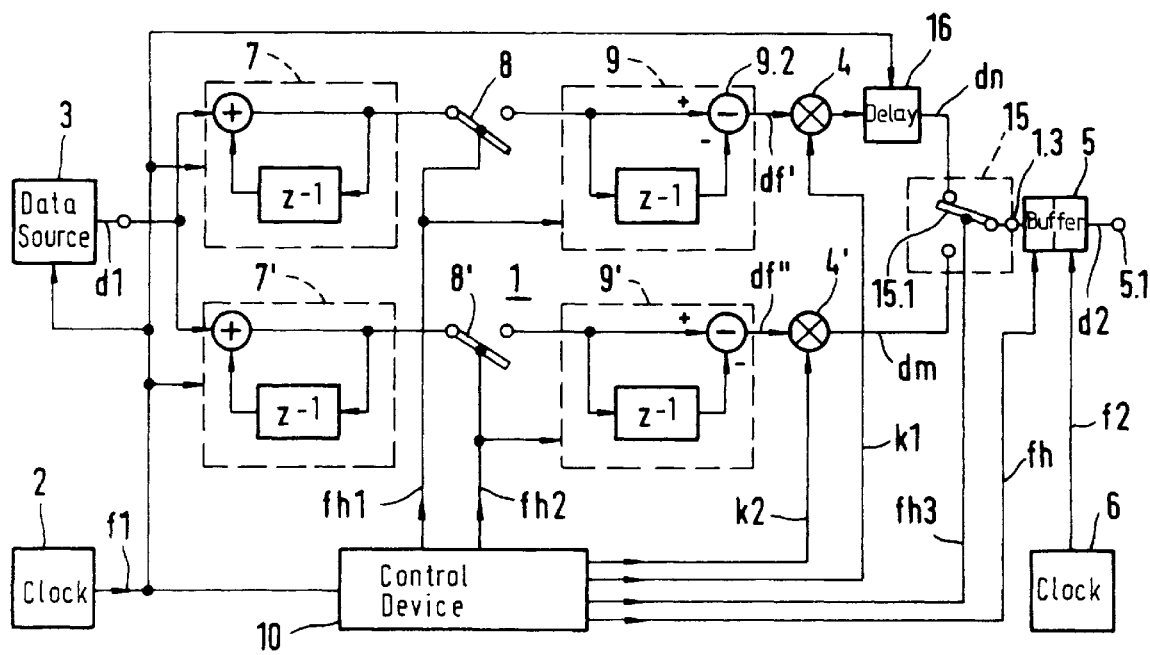
FIG. 2 is a block diagram of an embodiment with a parallel structure.

FIG. 2 shows an embodiment of the invention with a simple parallel comb filter structure. Functional units identical with those of FIG. 1 are designated by like reference characters, so that a renewed discussion is not necessary. The essential differences from FIG. 1 are that a first filter 7, 8, 9 is connected in parallel with a second filter 7', 8', 9', and that a combining device 15 is provided for combining the filtered output values df', df" of the first and second filters into a single data sequence d2.

The combining device 15 is constituted essentially by a changeover switch 15.1 which establishes a connection to the output of either the first switch 7, 8, 9 or the second switch 7', 8', 9' for tapping the first output values dn or the second output values dm, respectively. The output 1.3 of the combining device 15 is connected to a buffer 5.

The first filter 7, 8, 9 forms a new output value df' after every a samples of the input data sequence d1. Independently of the first filter, the second filter 7', 8', 9' forms a new output value df2" after every a+1 samples of the input data sequence d1. The formation of the output values df', df" need not be uniform but depends on the desired reduction factor r. By the closure of the decimation switches 8, 8', a respective new data window dw1, dw2 is started, the starting time being defined by the control device 10 by means of the respective control signals fh1, fh2. Simultaneously with the closure of the decimation switches 8, 8', the respective filter output provides a new output value df', df" which is assigned to the preceding data window and can be passed on or ignored by the combining device 15. This depends on the position of the changeover switch 15.1, which is controlled by a control signal fh3. The three control signals fh1, fh2, fh3 are locked to an auxiliary clock fh whose clock rate is formed according to the number n of first output values dn and the number m of second output values dm, which are determined by the rule for the desired reduction factor, r=a+m/(m+n).

In the embodiment of FIG. 2, the outputs of the first and second filters are provided with amplitude-normalizing devices 4 and 4', respectively, to compensate for the different gains. The associated attenuation factors k1, k2 are formed by the control device 10 and have the values k1=1/b and k2=1/c, for example. If an amplitude-normalizing device, generally a multiplier and/or a shift stage, is inserted after the terminal 1.3, one of the normalizing devices can be dispensed with. Depending on the intended use of the data sequence and on the value of the reduction factor r, it is not even necessary to switch between different gains.

The output of the first filter includes a delay element 16 with which the different group delays of the first and second filters can be compensated for in complete clock periods of the input clock signal f1. By timely starting the data window in conjunction with the group-delay equalization, discontinuities in the data sequence d2 at the instant of switching from the first filter to the second are thus largely avoided. The group-delay equalization is particularly important in the case of higher-order filters, because there differences increase with the ordinal number. The parallel filter structure, to which further parallel-connected filters may be added if necessary, in conjunction with the associated delay elements, permits perfect isolation of the starting and closing times of the data windows even if the data windows should overlap. If more than two filters are connected in parallel, the control becomes somewhat more complex, but the basic principle of switching parallel-connected filters which has been described with reference to FIG. 2 continues to apply.

The switchable filter device 1 with two first-order comb filters shown in FIG. 2 includes two accumulators 7, 7' at the input end, whose input and output signals are identical. Thus, one of these accumulators 7, 7' can be dispensed with, in which case the output of the other is connected to the two decimation switches 8, 8'. A similar example of how accumulators can be saved is illustrated by the filter structure of FIG. 3, which corresponds to a parallel combination of two third-order comb filters. The three series-connected accumulators 71, 72, 73 are connected at the output end to the two decimation switches 8, 8', which are each followed by three differentiators 91, 92, 93 and 91', 92', 93', respectively.

Figure 3:
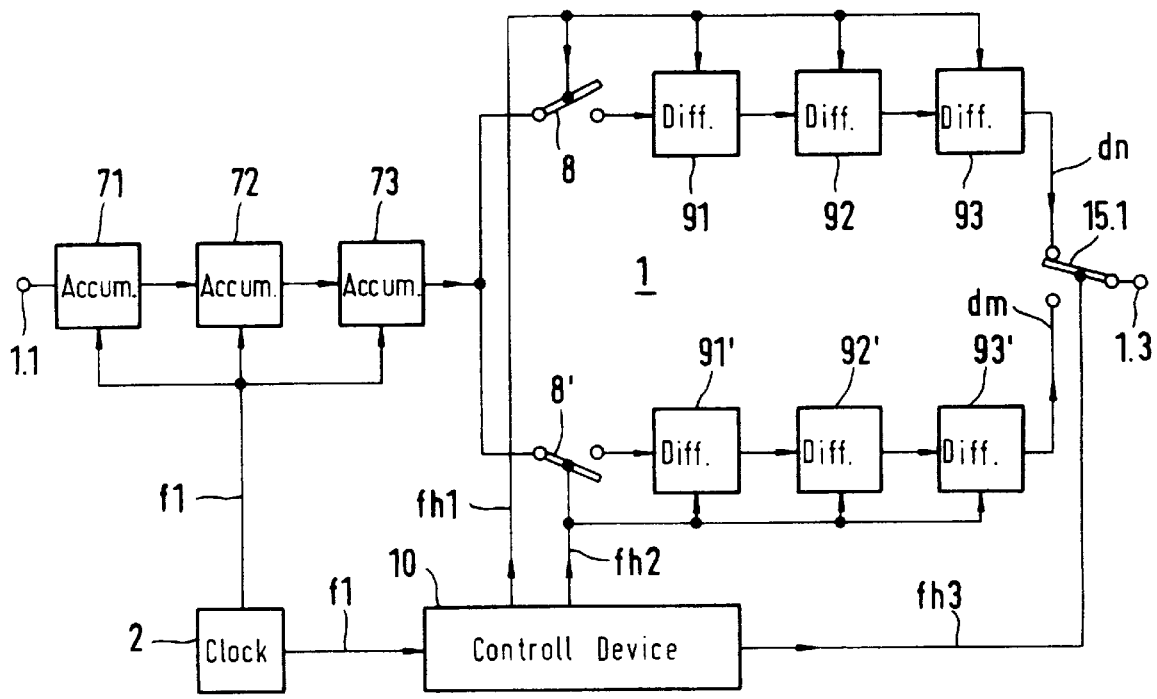
FIG. 3 is a block diagram of a higher-order parallel filter structure.
Figure 4:
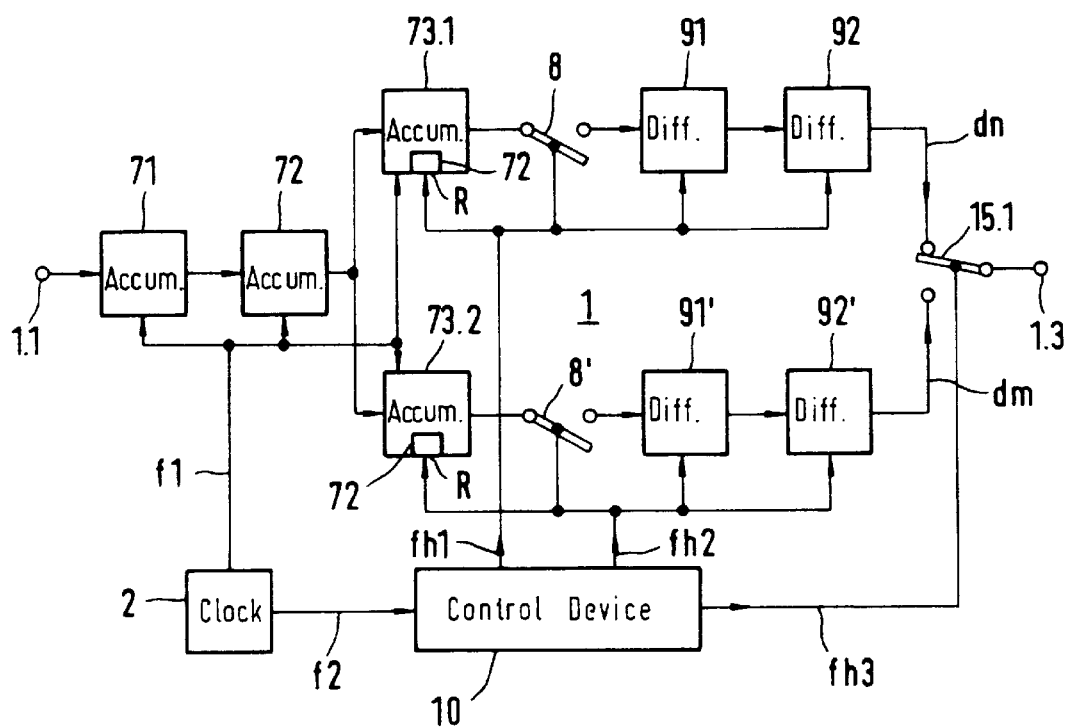
FIG. 4 is a block diagram of a filter structure equivalent to that of FIG. 3.

FIG. 4 shows a switchable filter device 1 whose transfer function is identical to that of the filter device of FIG. 3. The implementation of the switchable filter device 1 differs from that of the filter device of FIG. 3 in that each of the two filter branches contains only two series-connected decimators 91, 92 and 91', 92', respectively, that only two of the accumulators, 71, 72, are connected in series, and that a respective separate third accumulator 73.1, 73.2 is provided for each filter branch. The two third accumulators 73.1, 73.2 are accumulators with a resetting facility 73.3 which is reset simultaneously with the associated decimation switch 8, 8'. The use of the resettable accumulators 73.1, 73.2 eliminates the need for one decimator in each of the filter branches but requires an additional resettable accumulator 73.2 in the second filter branch, since the first resettable accumulator 73.1 is associated with the first filter branch. The first or second control signal fh1, fh2 at the reset input R initiates the start of the respective data window. It should be noted that the starting time of the data window dw1, dw2 does not depend on when the last control signal fh1, fh2 was triggered. The selection of the correct output values dn, dm is made by the changeover switch 15.1.

The control signals fh1, fh2, fh3 of the auxiliary clock fh are formed in the control device 10 by means of, e.g., the above-mentioned resettable counter and stored counts. The counts may be stored in a table which is addressable by means of the reduction factor r. A numerical example will illustrate again how temporal steps, and thus discontinuities, in the output data sequence d2 are prevented on a change of the sampling rate. It is important that the counters for the first and second filters be started with a suitable delay relative to each other. The delay must be chosen so that at the time of the change of the sampling rate, the two filter outputs make available new output values dn and dm, respectively.

If, for example, a third-order comb filter, i.e., three accumulators and three differentiators; in each filter branch, is used, and the sampling rate reduction factor r lies between 49 clock periods and 50 clock periods, the counter for the first filter must be started 3 clock periods after the counter for the second filter. Then, a new filtered sample df' is available at the first filter output after 3×49+3 clock periods, i.e., a total of 150 clock periods. Since the counter for the second filter was started three clock periods later, a new filtered output value df" is present there after 3×50 clock periods, i.e., also after 150 clock periods. This does not yet take into account the group-delay difference, so that a certain compensation can be achieved in the first filter branch by means of a delay element (not shown in FIG. 4, cf. FIG. 2). The group-delay differences are 1.5 clock periods.

The group delays depend on the ordinal numbers of the filters and on the respective window size and follow from the transfer function. This will now be illustrated by a numerical example for a second-order comb filter with the complex transfer function H(z) which is switched between the sampling rates 2 and 3. If a new output value is formed in a steady sequence after every two samples, the transfer function is $$H(z)=((1-z^{-2})/(1-z^{-1}))^2=1+2z^{-1}+z^{-2} \quad (1)$$

The tracking data window dw comprises three values of the data sequence d1, and the switchable filter device 1 is in the first state.

If the sampling intervals are switched from two to three or from three to two clock periods T1, the circuit will implement the transfer function $$H(z)=(1-z^{-2})\times(1-z^{-3})/(1-z^{-1})^2=1+2z^{-1}+2z^{-2}+z^{-3} \quad (2)$$

The tracking data window comprises four samples. The switchable filter device 1 is considered as being in the first or second state, depending on the final state of the change.

If a new output value is formed in a steady sequence after every three samples, the circuit will implement the transfer function $$H(z)=((1-z^{-3})/(1-z^{-1}))^2=1+2z^{-1}+3z^{-2}+2z^{-3}+z^{-4} \quad (3)$$

The tracking data window comprises five samples, and the switchable filter device is in the second state.

As a rule, switching will take place only between the transfer functions (1) and (2) or the transfer functions (2) and (3) because the sequence of first and second output values should be alternating as far as possible. The transfer functions (1) and (2) must be used only if the previous state was identical. For a reduction factor of r=2.9, for example, the transfer functions (2) and particularly (3) would be suitable, because, according to the rule r=a+m/(n+m), there is only one first sample dn with two sampling intervals for nine second samples dm with three sampling intervals. A better alternation is not possible here. This applies even more if the sampling rate ratio is even more one-sided with respect to the two sampling intervals a and a+1, e.g. for a sampling rate reduction factor of r=2.99.

The individual transfer functions (1), (2), and (3) show that for the formation of the filtered data values df, the samples in the respective data window dw are weighted differently. From the example it is also apparent that the gain has the value 4 in the first state, the value 6 in the state of change, and the value 9 in the second state. By means of the amplitude-normalizing device 4 and the attenuation factor k, the different gains for the filtered data values df can be compensated for.

From the example with the second-order comb filter, the purely program-controlled implementation is also readily apparent. The individual samples are first buffered and then added with the appropriate weighing by means of an existing arithmetic unit in a processor. Simulation with accumulators, decimation switches, and differentiators is not necessary for this purpose.

FIG. 5 shows a timing diagram which illustrates the operation of the circuit of FIG. 1 or FIG. 2 for a data rate reduction factor of r=2.4. Of an input data sequence d1, the sampling instants are shown schematically as prostrate crosses which are numbered from 5 to 26. This data sequence d1 is divided into equally long time periods I, namely I1, I2, I3, each comprising 12 sampling intervals T1 which are defined by the first clock signal f1. In the representation, the first and second time periods I1, I3 are incomplete, and the complete second period I2 extends from sample 9 to sample 21. For the desired sampling rate reduction factor r=2.4, each of the time periods I1, I2, I3, which comprises 12 clock periods T1, must be subdivided into three subperiods with two clock periods T1 and two subperiods with three clock periods T1. For each of the individual time periods, there is at least one corresponding tracking data window dw or dw1, dw2, whose first and second window sizes dwf1, dwf2 comprise, respectively, b=2 and c=3 samples for averaging. If two independent tracking data windows dw1, dw2 are present as is the case with a parallel filter structure, the window size dwf1 will be assigned to the first data window dw1 and the window size dwf2 to the second data window dw2. The window size dwf1 with b samples corresponds to the first state of the switchable filter device 1, and the window size dw2 with c samples corresponds to the second state.

From the timing diagram of FIG. 5 it can also be seen that the nonequidistant auxiliary clock fh and the tracking data window with the window sizes dwf1, dwf2 are locked to the input data sequence d1, and thus to the first clock signal f1.

From the average of the samples in the respective data window dw or dw1, dw2, the filtered data values df are formed, which are temporarily stored in the buffer 5 until they are retrieved by the second clock signal f2, the output clock, and form the n first output values dn or m second output values dm of the data sequence d2.

For example, the samples 5 and 6 of the sequence d1 form the output value n3.1 of the data sequence d2. The last samples 7, 8, 9 in the interval I1 form the output value m2.1, the last value of the interval I1. The first output value of the second interval I2 is the output value n1.2, which is formed from samples 10 and 11 of the data sequence d1.

Depending on the size dwf1, dwf2 of the associated data window, a distinction is made in the data sequence d2 between first output values dn (denoted in FIG. 5 by n . . . ) and second output values dm (denoted in FIG. 5 by m . . . ). The data sequence d2 from n3.1 to m1.3 is numbered in FIG. 5 from 4 to 12. Since the data sequence d2 is locked to the output clock f2, the new samples n3.1 to m1.3 follow each other equidistantly, with the data rate being determined by the period T2.

After every 12 sampling intervals T1, coincidence is obtained between the first and second clock signals f1, f2. However, this is not mandatory, since in reality, phase differences between the first and second clock signals f1, f2 can be compensated for by the buffer 5. It is even possible to temporarily store an entire block of filtered data values df in a large buffer, such as a FIFO memory (FIFO=first-in-first-out) and then read it out burst by burst at a different frequency.

Although the invention has been described in preferred and alternative forms with a certain degree of particularity, it is understood that the present disclosure of the preferred and alternative forms has been made only by way of example, and that numerous changes in the details of construction and combination and arrangement of parts may be made without departing from the spirit and scope of the invention as hereinafter claimed. It is intended that the patent shall cover by suitable expression in the appended claims, whatever features of patentable novelty exist in the invention disclosed.

I claim:

1. A device for reducing the data rate of a data sequence (d1), comprising:
   a switchable filter device (1) which delivers first output values (dn) after a sampling intervals in a first state and second output values (dm) after a+1 sampling intervals in a second state, and has at least one tracking data window (dw; dw1, dw2) for forming filtered data values (df'; df', df''), wherein
   if only one tracking data window (dw) is present, this data window (dw) is assigned at least two different window sizes (dwf1, dwf2) whose selection is dependent on the sequence of the first (dn) and second output values (dm), and,
   if more than one tracking data window (dw1, dw2) are present, these are assigned at least two different window sizes (dwf1, dwf2), and the selection of the respective data window (dw1, dw2) with the associated window size is dependent on the sequence of the first (dn) and second output values (dm), and
   one (dwf1) of the window sizes (dwf1, dwf2) comprises b samples, and the other (dwf2) c samples, with $b \geq a$ and $c \geq a+1$; and
   a control device (10) which is coupled to the switchable filter device (1) and, by means of the first and second states, causes the formation of n first output values (dn) and m second output values (dm) as well as the selection of the associated window sizes (dwf1, dwf2) or data windows (dw1, dw2) within equally long time periods (I2) of the data sequence d1, the number of n first (dn) and m second output values (dm) being determined by a rule r=a+m/(n+m), where r is a data rate reduction factor.

2. The device of claim 1, wherein the switchable filter device (1) corresponds to the parallel combination of a first filter (7, 8, 9) and a second filter (7', 8', 9') which produce the n first (dn) and m second output values (dm), respectively, which are combined into a data sequence (d2) by a combining device (15).

3. The device of claim 2, wherein the first filter (7, 8, 9) and the second filter (7', 8', 9') correspond, respectively, to a first comb filter and a second comb filter of arbitrary order.

4. The device of claim 3, wherein the direction of signal flow, the first and second comb filters are each assigned either
   p accumulators (71, 72, 73), a decimation switch (8, 8'), and p differentiators (91, 92, 93; 91', 92', 93')
   or p accumulators (71, 72, 73.1; 71, 72, 73.2), a decimation switch (8, 8'), and p−1 differentiators (91, 92; 91', 92'), with the last accumulator (73.1;73.2) in the direction of signal flow being reset by means of a resetting facility (73.3) simultaneously with the closure of the decimation switch (8, 8'), and with $p \geq 1$.

5. The device of claim 1, wherein the different gains of the switchable filter device (1) are compensated for, at least in part, by means of an amplitude-normalizing device.

6. The device of claim 1, wherein by means of an equalizing device (16), different groups delays of the switchable filter device (1) are adapted to one another.

7. The device of claim 6, wherein the equalizing device (16) includes a delay element.

8. The device of claim in claim 7, wherein by means of a computing device in the control device (10), the time of activation of the decimation switch (8; 8, 8') and/or of the resetting facility (73.3) is determined.

9. A device for reducing the input data rate of an input data sequence comprising:
   a first clock means for providing a first clock signal dependent upon said input data rate;
   an accumulator coupled to said first clock means for receiving said input data sequence;
   a decimation switch coupled to said accumulator for transferring data derived from said input data sequence;
   a differentiator coupled to said decimation switch for receiving said transferred data; and,
   a buffer coupled to said differentiator and to a second clock means, said second clock means providing a second clock signal dependent upon said reduced data rate, said buffer for receiving a time averaged data sequence associated with said input data sequence from said differentiator and for providing said time averaged data sequence at said reduced data rate.

10. The device of claim 9, further comprising a control device coupled to said first clock means, said decimation switch, said differentiator and said buffer.

11. The device of claim 10, further comprising an amplitude normalization device coupled between said switchable filter device and said buffer, said amplitude normalization device further being coupled to said control device.

12. The device of claim 10, wherein said control device generates a third, non-equidistant clock signal from said first clock.

13. The device of claim 9, wherein said decimation switch is responsive to a third clock signal, wherein the Fourier transform of said third clock signal comprises substantially all harmonics of a fundamental frequency.

14. The device of claim 9, wherein said decimation switch is responsive to a third clock signal comprising a plurality of peaks, wherein the duration between each of said peaks of said plurality is not constant.

15. The device of claim 9, further comprising:
   at least one additional accumulator coupled to said data source;
   at least one additional decimation switch coupled to said at least one additional accumulator; and,
   at least one additional differentiator coupled to said at least one additional decimation switch; and,
   a combining device coupled between said buffer and said differentiators such that a single data sequence is provided to said buffer.

16. A method for converting an input data sequence having an input data rate to a corresponding output data sequence at a different output data rate comprising:
   in a first mode, averaging said input data sequence over a first time interval to determine an output data sequence value corresponding to said first mode;
   in a second mode, averaging said input data sequence over a second time interval to determine an output data sequence value corresponding to said second mode; and,
   selectively outputting said output data sequence values corresponding to said first and second modes at said second data rate to form said output data sequence;
   wherein the duration of said second time interval is dependent upon the duration of said first time interval and the ratio of said input data rate to said output data rate, and, wherein the ratio of said output data sequence values output from said first mode to said output data sequence values output from said second mode is dependent upon said first and second interval durations and said ratio of said input data rate to said output data rate.

17. The method of claim 16, wherein said first and second time intervals are unequal.

18. The method of claim 16, wherein said first and second modes are selectively repeated.

19. The method of claim 16, wherein said ratio of said input data rate to said output data rate is any rational number including integer fractions.

20. The method of claim 16, wherein the number of input data sequence values averaged in said first mode differs from the number of input data sequence values averaged in said second mode.

* * * * *